United States Patent
Serizawa et al.

(10) Patent No.: US 6,528,742 B2
(45) Date of Patent: Mar. 4, 2003

(54) SWITCH UNIT WITH MEMBRANE TYPE, FLEXIBLE PRINTED CIRCUITRY

(75) Inventors: Yasuyoshi Serizawa, Shizuoka (JP); Minoru Kubota, Shizuoka (JP); Keizo Nishitani, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/987,747

(22) Filed: Nov. 15, 2001

(65) Prior Publication Data

US 2002/0060146 A1 May 23, 2002

(30) Foreign Application Priority Data

Nov. 17, 2000 (JP) .......................................... 2000-351364

(51) Int. Cl.[7] .......................... H01H 9/02; H01H 13/70; H05K 1/02; H05K 7/08
(52) U.S. Cl. ........................ 200/5 R; 200/5 A; 200/292; 361/749
(58) Field of Search ................................ 200/5 R, 5 A, 200/512–517, 292; 361/749–751, 752, 679–748; 400/472–489

(56) References Cited

U.S. PATENT DOCUMENTS

| | | | | |
|---|---|---|---|---|
| 4,467,150 A | * | 8/1984 | Leitermann et al. | ........ 200/5 A |
| 4,560,844 A | * | 12/1985 | Takamura et al. | .......... 200/5 A |
| 4,640,994 A | * | 2/1987 | Komaki | ...................... 200/5 A |
| 4,972,051 A | * | 11/1990 | Hodsdon | .................... 200/5 A |
| 4,977,298 A | * | 12/1990 | Fujiyama | ................... 200/5 A |
| 5,693,920 A | * | 12/1997 | Maeda | ........................ 200/1 B |
| 6,239,392 B1 | * | 5/2001 | Serizawa et al. | ........... 200/5 R |

\* cited by examiner

Primary Examiner—J. R. Scott
(74) Attorney, Agent, or Firm—Sughrue Mion, PLLC

(57) ABSTRACT

A flexible printed circuit (FPC) (23) and a rubber contact (27), superposed on this FPC (23), are received and held in a lower casing (30) and an upper casing (40), and key tops (29a to 29g) are mounted on the upper casing (40), and can open and close respective switch contacts (23a), provided on the FPC (23), through the rubber contact (27). Those portions of an upper surface of a bottom wall (31) of the lower casing (30), opposed respectively to switch-mounting portions (43a to 43e) of the upper casing (40), are defined by flat surfaces, respectively, and electronic parts (25) are mounted in a concentrated manner on those regions of the FPC (23) disposed respectively on the flat surfaces (34) of the lower casing (30).

5 Claims, 7 Drawing Sheets

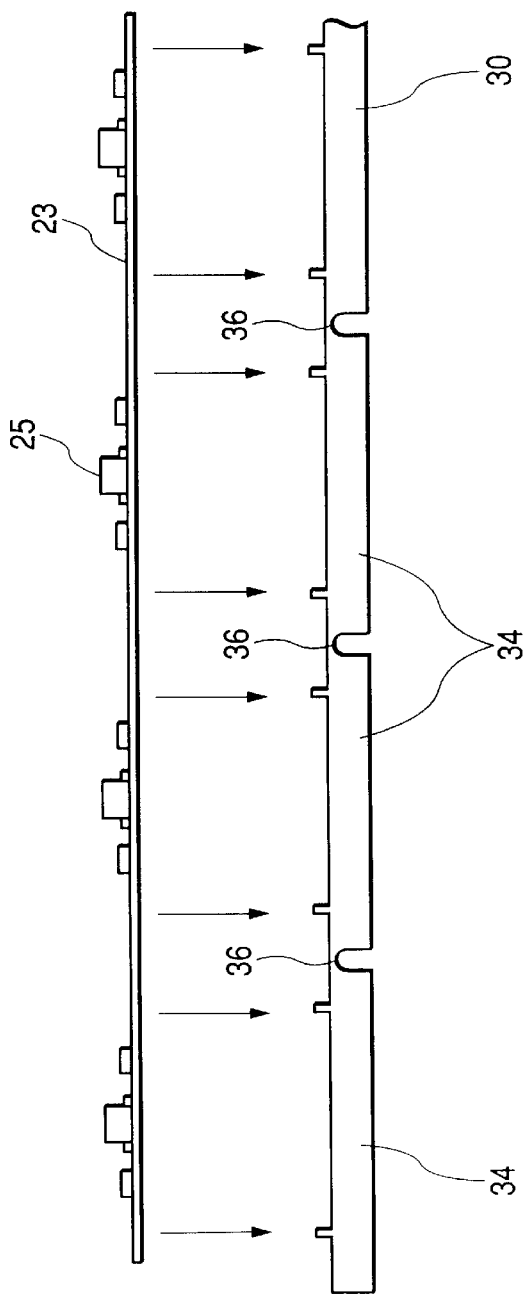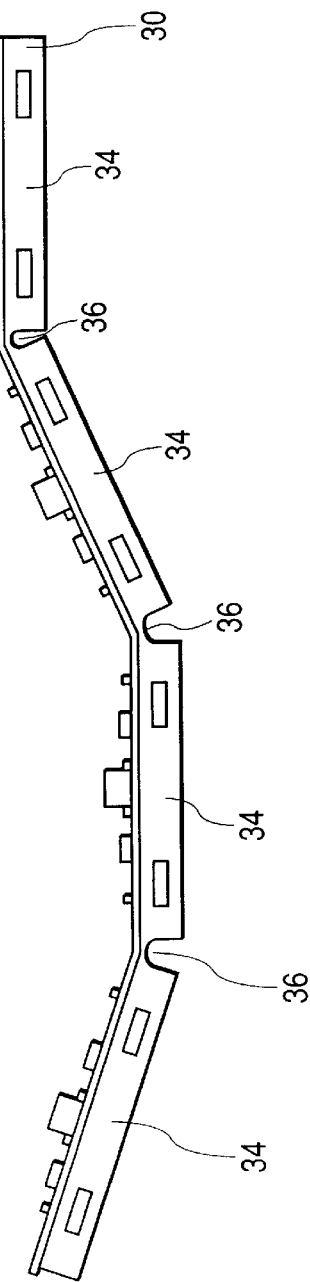

SWITCH UNIT WITH MEMBRANE TYPE, FLEXIBLE PRINTED CIRCUITRY

BACKGROUND OF THE INVENTION

This invention relates to a switch unit mounted, for example, on a door panel of a vehicle or the like, and more particularly to an improvement of a switch unit in which a flexible printed circuit member (serving as a wiring circuit member), on which electronic parts are mounted by soldering, and a rubber contact for opening and closing switch contacts on the flexible printed circuit member, are received and held in a casing of a curved structure divided into two (upper and lower) sections, that is, a lower casing and an upper casing.

Various kinds of power-window switch units, installed in the door panels, for opening and closing window pane have been developed, these units includes a wiring circuit member on which electronic parts are mounted by soldering, and a casing which is divided into two (upper and lower) sections, that is, a lower casing and an upper casing for receiving the wiring circuit member received and held therein, and switches for opening and closing circuit contacts within the casing are provided on an upper surface of the upper casing.

In such a switch unit, for example, the surface of the upper casing, on which the switches are provided, is, in many cases, formed into a curved structure in order to enhance the operability of the switches and also to match its design with the interior design. Therefore, in order to enhance the ability of reception into the casing of a curved structure, the wiring circuit member to be received in the switch unit is required to have flexibility so that an undue force will not act on this wiring circuit member arranged in conformity with the curved surface within the casing. In addition to the electric circuits for the power windows, various electric circuits, for example, for adjusting power seats and for controlling courtesy lamps are incorporated in a door panel or the like of the vehicle. Therefore, in order to achieve a high packaging density in a limited space within the door, the wiring circuit member, used in the switch unit, is also required to have a space-saving design.

In order to meet these requirements, there have recently been extensively used flexible printed circuits (hereinafter referred to as "FPC") as a wiring circuit member on which electronic parts are mounted by soldering, and this flexible printed circuit has a wiring circuit printed on a film-like or a sheet-like thin flexible insulative substrate.

FIGS. 10 and 11 show a related switch unit in which an FPC is used as a wiring circuit member on which electronic parts are mounted.

The switch unit 1 includes switches for power windows of a vehicle and other switches and is mounted on a door panel, and is so constructed that the FPC 5 (serving as a wiring circuit member) on which the electronic parts 3 are mounted by soldering, and a rubber contact 7 (serving as a switch mechanism) for opening and closing switch contacts on the FPC 5, are received and held in a casing 11 of a curved structure divided into two (upper and lower) sections, that is, a lower casing 9 and an upper casing 10.

The rubber contact 7 is superposed on an upper surface of the FPC 5, and is the switch mechanism in which each of contact opening-closing conductors 7a for opening and closing the switch contacts 5a formed on the FPC 5 is supported by a bulged rubber wall 7b in spaced relation to the switch contact 5a.

As shown in FIG. 11, a key top 13 serving as a switch operating member for opening and closing the switch contacts 5a through the rubber contact 7 are provided on the rubber contact 7 in a displaceable manner.

The key top 13, when displaced toward the rubber contact 7, elastically deforms the rubber wall 7b of the rubber contact 7 toward the FPC 5, so that the contact opening-closing conductor 7a on the rubber contact 7 is brought into contact with the witch contact 5a on the FPC 5.

The lower casing 9 and the upper casing 10 have the smoothly-curved structure, and the FPC 5 and the rubber contact 7 are received and held in these casings in a curved condition corresponding to the curved structure of the casings 9 and 10.

However, the whole of the structure is formed into the curved structure, and the switch mechanism is provided on the curved surface. In this form, for example, when the key top 13 is pressed down as indicated by arrow A in FIG. 12 to elastically deform the rubber wall 7b of the rubber contact 7, the rubber wall 7b is subjected to flexural deformation not by an originally-expected vertical load acting in a direction which the rubber wall 7b extends but by a load acting in a direction inclined relative to the direction which the rubber wall 7b extends as indicated by arrow B. As a result, there is encountered a problem that the deformation is concentrated on part of the rubber wall 7, so that the rubber wall 7 is liable to be broken.

Further, there was a possibility of contact failure between the contact opening-closing conductor 7a and the switch contact due to that the displacement position of the contact opening-closing conductor 7a shifts by flexural displacement of the rubber wall 7b.

As shown in FIG. 13, the portion 15 of the FPC 5, to which the electronic part 3 is soldered, is kept lifted off a bottom wall surface of the lower casing 9 because of the curved structure of the lower casing 9, and therefore, the portion 15 is vibrated by vibrations, developing during the running of the vehicle, and this leads to a possibility that a joint portion, formed by solder, is cracked or separated.

SUMMARY OF THE INVENTION

This invention has been made in view of the above circumstances, and an object of the invention is to provide a switch unit in which a casing receiving a flexible printed circuit and a rubber contact can be formed into a curved structure suitable for the switch operability and so on, and further the durability and reliability of the switch unit are excellent.

In order to solve the aforesaid object, the invention is characterized by having the following arrangement.

(1) A switch unit mounted on a curved structure comprising:
   a flexible printed circuit including a wiring circuit formed on an insulative substrate, electric parts and switch contacts being mounted on an upper surface of the flexible printed circuit;
   a lower casing which holds the flexible printed circuit and includes a bottom wall covering a lower surface of the flexible printed circuit and including a plurality of flat surfaces;
   a rubber contact, for opening and closing the switch contacts, superposed on the upper surface of the flexible printed circuit;
   an upper casing which includes an upper wall covering the rubber contact, a plurality of switch mounting portions respectively opposed to the plurality of flat surfaces of the bottom wall, and an engagement member through which the upper casing is connected to the lower casing; and a plurality of key tops, for operating the rubber contact, mounted on the plurality of switch mounting portions, respectively, wherein the electric parts and the switch contacts are located above the plurality of flat surfaces.

(2) A switch unit according to (1), wherein one of a bending portion and a bending-assisting member for enhancing the flexibility of the flexible printed circuit is provided at a portion of the flexibility of the flexible printed circuit which corresponds to a border of the flat surface.

(3) A switch unit according to (1), wherein the adjacent flat surfaces are connected together by hinge, and the lower casing can be formed into a curved shape corresponding to the upper casing by adjusting the degree of bending the hinge.

(4) A switch unit according to (1), wherein the bottom wall includes the plurality of flat surfaces and a curved surface.

(5) A switch unit according to (2), wherein the bottom wall includes the plurality of flat surfaces and a curved surface, and the border of the flat surface is defined between the flat surface and the curved surface.

BRIEF DESCRIPTION OF THE DRAWINGS

FIG. 7 is a schematic side-elevational view of a second embodiment of a lower casing used in the switch unit of the invention.

FIG. 8 is a view explanatory of the operation of the lower casing of FIG. 7.

DETAILED DESCRIPTION OF PREFERRED EMBODIMENTS

A preferred embodiment of a switch unit of the present invention will now be described in detail with reference to the drawings.

Figure 1:
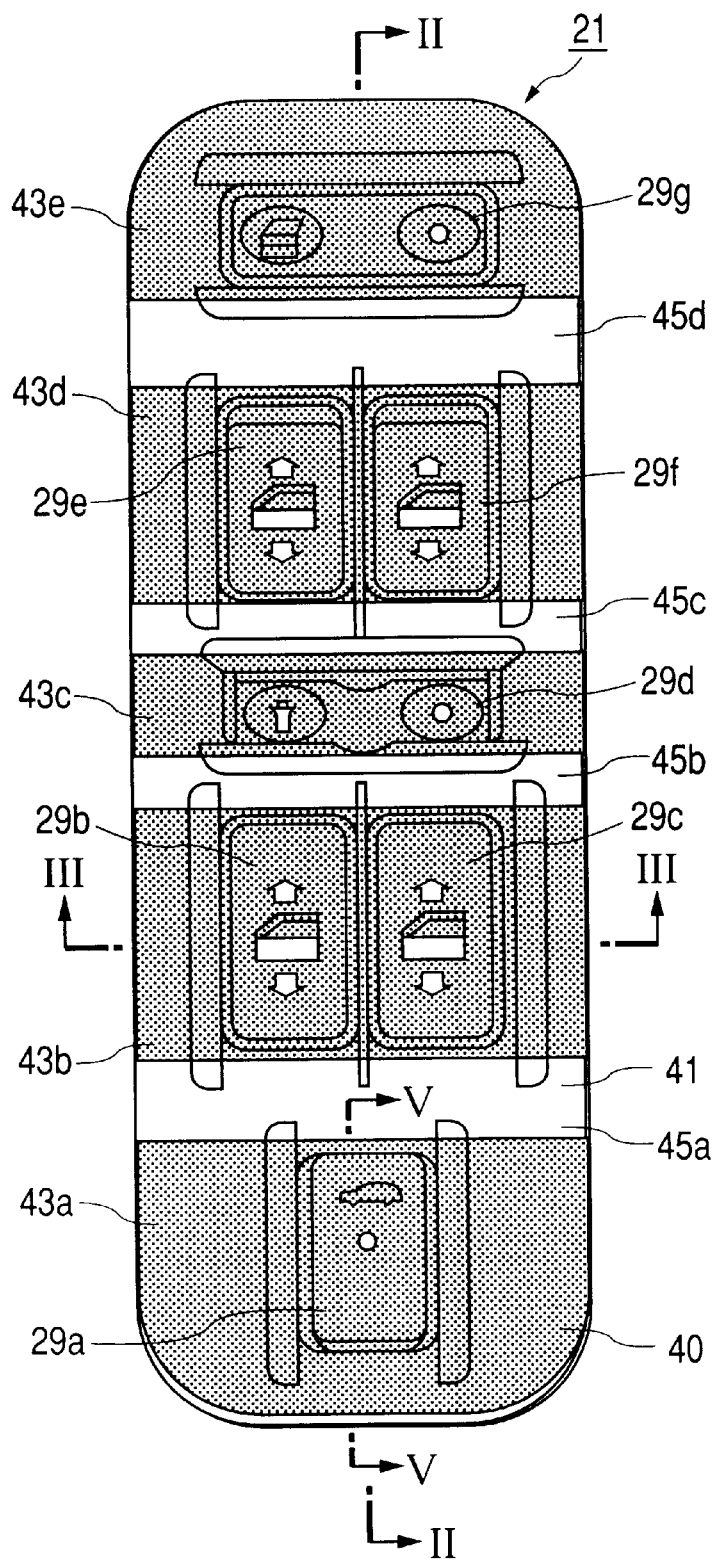
FIG. 1 is a top plan view of a first embodiment of a switch unit of the present invention.
Figure 2:
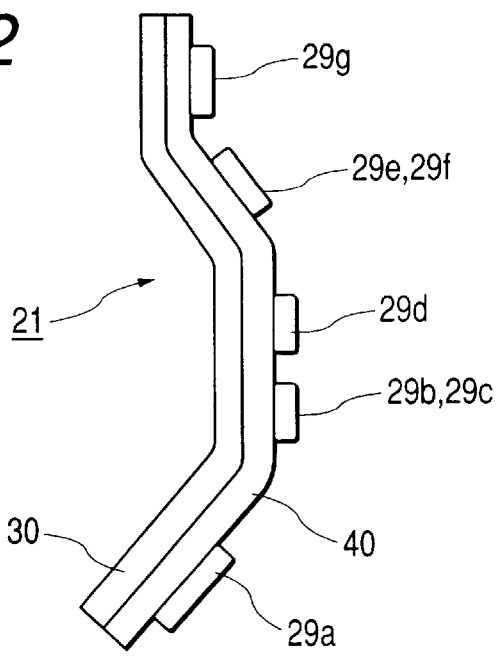
FIG. 2 is a schematic cross-sectional view taken along the line II—II of FIG. 1.
Figure 3:
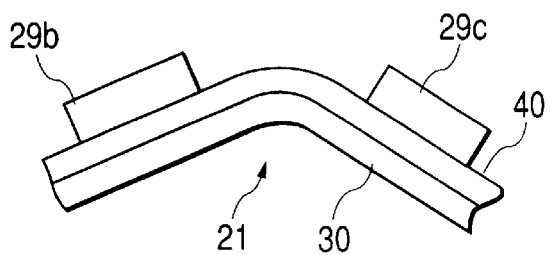
FIG. 3 is a schematic cross-sectional view taken along the line III—III of FIG. 1.
Figure 4:
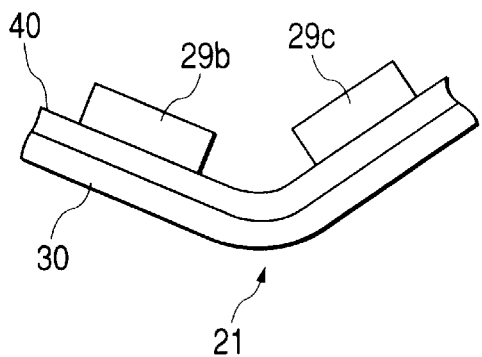
FIG. 4 is a schematic view showing a modified example of a casing of a curved configuration shown in FIG. 3.
Figure 5:
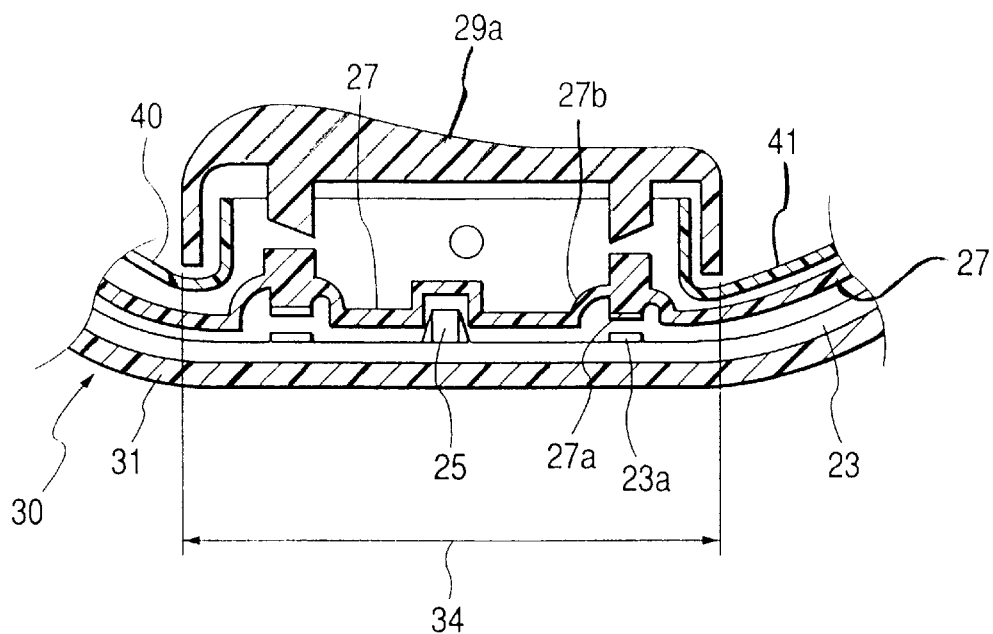
FIG. 5 is an enlarged cross-sectional view taken along the line V—V of FIG. 1.
Figure 6:
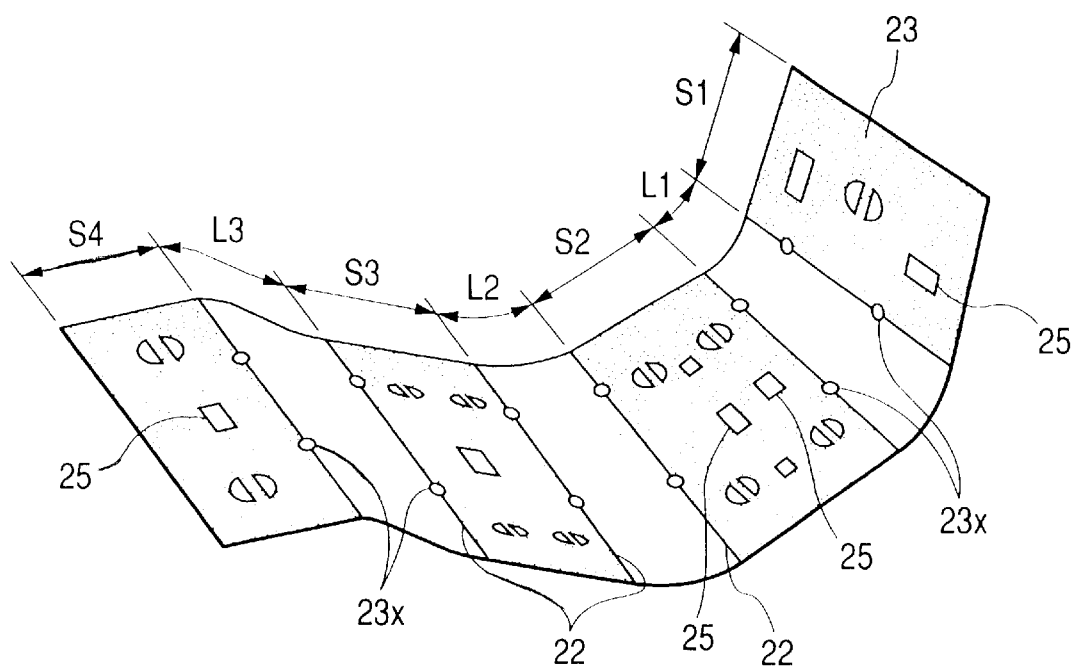
FIG. 6 is a perspective view showing the structure of a flexible printed circuit used in the switch unit of FIG. 1.

FIGS. 1 to 6 show the first embodiment of the switch unit of the invention. FIG. 1 is a top plan view of the switch unit of the invention, FIG. 2 is a schematic cross-sectional view taken along the line II—II of FIG. 1, FIG. 3 is a schematic cross-sectional view taken along the line III—III of FIG. 1, FIG. 4 is a schematic view showing a modified example of a casing of a curved configuration shown in FIG. 3, FIG. 5 is an enlarged cross-sectional view taken along the line V—V of FIG. 1, and FIG. 6 is a perspective view showing a flexible printed circuit used in the switch unit of FIG. 1.

The switch unit 21 in the first embodiment includes power window switches for electrically operating windows of a vehicle so as to open and close the same, and other several kinds of switches, and is mounted on a door panel of the vehicle or the like.

As shown in FIG. 5, the switch unit 21 comprises: an FPC 23 having a wiring circuit printed on a film-like or a sheet-like thin flexible insulative substrate, electronic parts 25 being mounted on an upper surface thereof by soldering; a lower casing 30 which receives and holds the FPC 23 and has a bottom wall 31 covering the lower surface of the FPC 23; a rubber contact 27 which is superposed on the upper surface of the FPC 23 and has rubber walls 27b through which contact opening-closing conductors 27a (for respectively opening and closing switch contacts 23a formed on the upper surface of the FPC 23) are supported respectively in spaced relation to the respective switch contacts 23a; an upper casing 40 which includes an upper wall 41 covering an upper surface of the rubber contact 27 and at least one engagement member (not shown) through which this upper casing is connected to the lower casing 30; and key tops (switch operating means) 29a to 29g mounted on the upper casing 40 in a displaceable manner so as to elastically deform the rubber walls 27b, respectively, to bring the contact opening-closing conductors 27a into contact with the switch contacts 23a, respectively.

As shown in FIG. 1, switch-mounting portions (those regions indicated by shading) 43a to 43e of the upper casing 40, at which the key tops 29a to 29g are mounted, are defined by flat walls, respectively, and non-switch-mounting portions 45a to 45d, each lying between the adjacent ones of the switch-mounting portions 43a to 43e, are defined by bent walls or curved walls, respectively. Therefore, the whole of the surface is formed into a curved structure which achieves a good operability of the key tops 29a to 29, and is excellent in design, as shown in FIG. 2.

In this embodiment, from the viewpoints of the switch operability and the design, the casing formed by the lower casing 30 and the upper casing 40 can be raised or curved upwardly at a widthwise-central portion thereof as shown in FIG. 3, or can be recessed or curved downwardly at the central portion thereof as shown in FIG. 4.

As shown in FIG. 5, the portions of the upper surface of the bottom wall 31 of the lower casing 30 (on which the FPC 23 is placed) which is opposed respectively to the switch-mounting portions 43a to 43e are formed respectively into flat surfaces 34 disposed parallel to the switch-mounting portions 43a to 43e, respectively. Interconnecting portions, each lying between the adjacent ones of these flat surfaces 34, are defined by bent walls or curved walls, respectively, as described above for the non-switch-mounting portions 45a to 45d. Therefore, as a whole, the lower casing is formed into curved structure corresponding to that of the upper casing 40.

On the other hand, as shown in FIG. 6, the electric parts 25 are mounted in a concentrated manner on regions S1 to S4 of the FPC 23 which are disposed respectively on the flat surfaces (flat portions) 34 of the lower casing 30, and correspond to the switch-mounting portions 43a to 43e of the upper casing 40. Namely, the regions on which the electronic parts 25 are mounted are set to these regions S1 to S4.

In the FPC 23, a bending portion 22 or a bending-assisting member 23x for enhancing the flexibility is provided at the border between each region S1 to S4 (on which the electronic parts 25 are mounted in a concentrated manner) and its adjoining region L1 to L3 lying between the adjacent regions S1 to S4. In this embodiment, although the bending-assisting member 23x comprises a plurality of very small through holes formed through the insulative substrate of the FPC 23, it may comprise slits extending along the boundary between the adjacent regions.

In the above switch unit 21, the plurality of flat switch-mounting-portions 43a to 43e of the upper casing 40 are connected together in a continuous manner by the non-flat non-switch-mounting portions 45a to 45d, and by suitably adjusting the degree of bending or curving of the non-switch-mounting portions 45a to 45d, the upper casing can have the desired curved structure as a whole which is excellent in switch operability, design and so on.

The flat surfaces 34 are formed on the upper surface of the bottom wall 31 of the lower casing 30 (which receives and holds the FPC 23) in opposed relation to the switch-mounting portions 43a to 43e of the upper casing 40, and are disposed parallel to the switch mounting portions 43a to 43e, respectively. Therefore, by operating each of the key tops 29a to 29g mounted on the upper casing 40, the corresponding rubber wall 27b of the rubber contact 27 can be elastically deformed properly in an originally-expected vertical direction. Therefore, when each switch is operated, the rubber contact 27 will not be subjected to flexural deformation different from the originally-expected deformation, and therefore is prevented from being broken.

The electronic parts 25 are mounted in a concentrated manner on the regions S1 to S4 of the FPC 23 disposed respectively on the flat surfaces 34 of the lower casing 30 corresponding respectively to the switch-mounting portions 43a to 43e of the upper casing 40. Therefore, the FPC is properly held in good contact manner with the lower casing 30 around joint portions of the electronic parts 25.

Therefore, the soldered electronic parts 25 are prevented from being lifted off the lower casing 30. Therefore, there will not be encountered a situation in which the joint portions lifted off the lower casing 30 are damaged by the vibration such as vibrations of the vehicle, and therefore, the joint portions formed by solder and the switch mechanism can be enhanced in durability and reliability.

Further, in this embodiment, the bending portion 22 or the bending-assisting member 23x for enhancing the flexibility is provided at the border between each region S1 to S4 (on which the electronic parts 25 are mounted in a concentrated manner) and its adjoining region L1 to L3, so that the FPC 23 can be easily bent or folded at these boundary portions. Therefore, the regions S1 to S4, to which the electronic parts 25 are soldered, can be more stably held in good contact manner with the flat surfaces 34 of the lower casing 30, respectively, so that the assembling ability of the switch unit 21 can be made better.

As shown in FIG. 7, the lower casing 30 for supporting the FPC 23, can be constructed such that flat surfaces 34 corresponding to the switch-mounting portions 43a to 43e are connected together through thin hinges 36 so that the lower casing can be folded, and by adjusting the degree of bending of the thin hinges 36, the lower casing can be formed into a curved structure corresponding to that of the upper casing 40, as shown in FIG. 8.

Figure 9A:
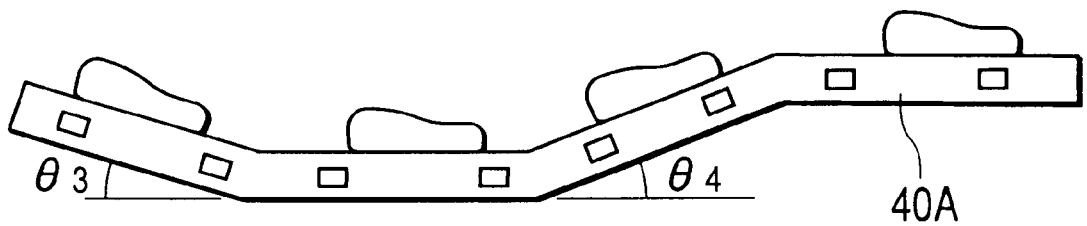
FIGS. 9A and 9B are views explanatory of upper casings of a curved structure with which the lower casing of FIG. 7 can be used.
Figure 9B:
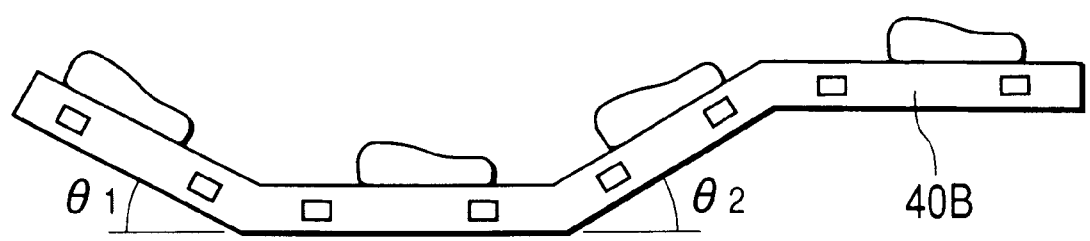
Figure 10:
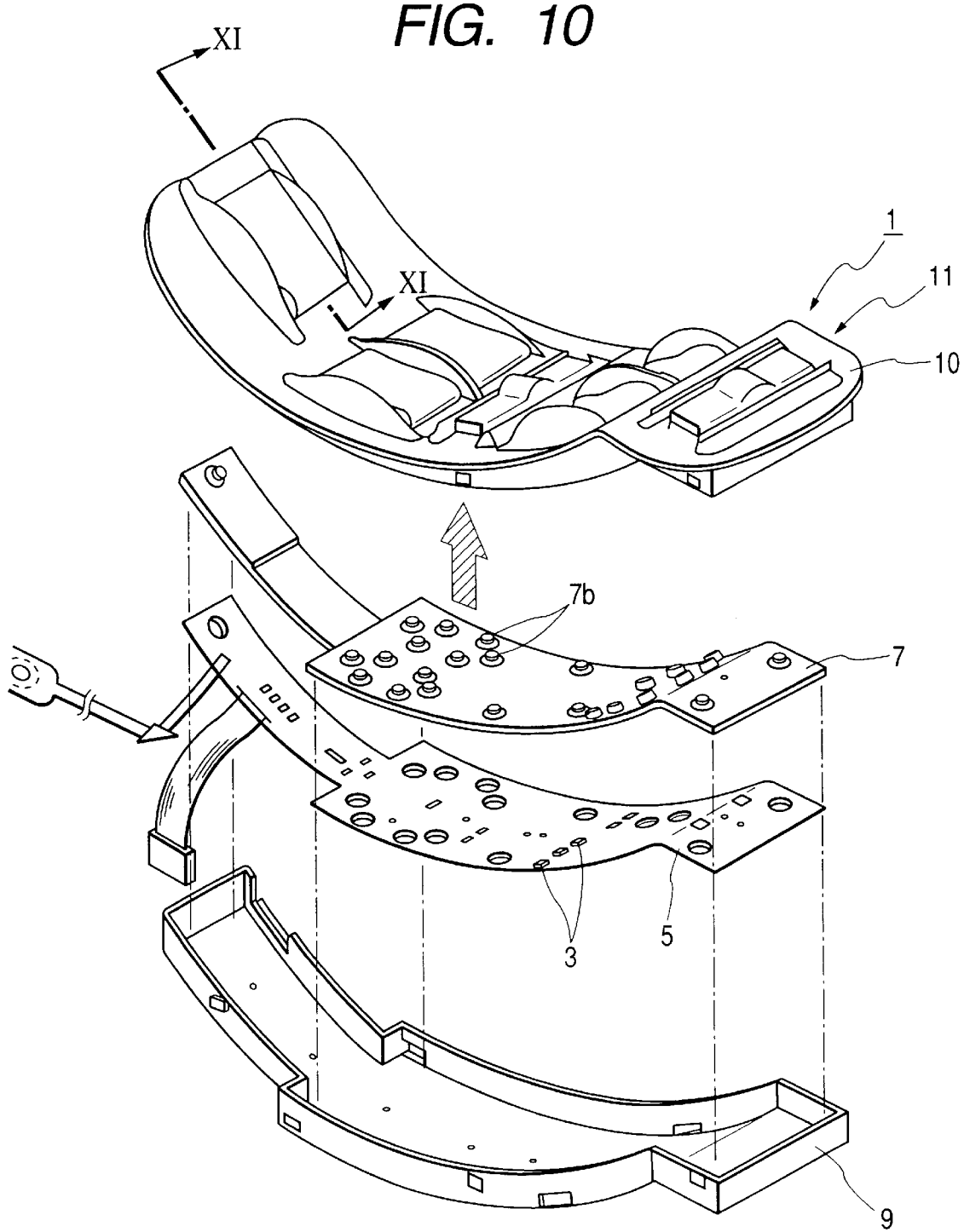
FIG. 10 is an exploded, perspective view of a related switch unit.
Figure 11:
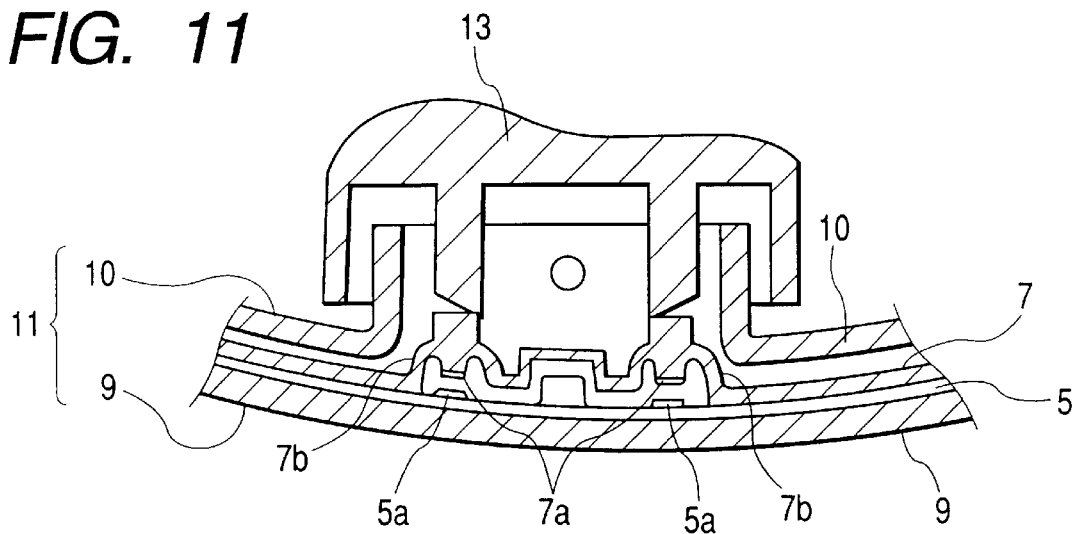
FIG. 11 is a cross-sectional view taken along the line X1—X1 of FIG. 10.
Figure 12:
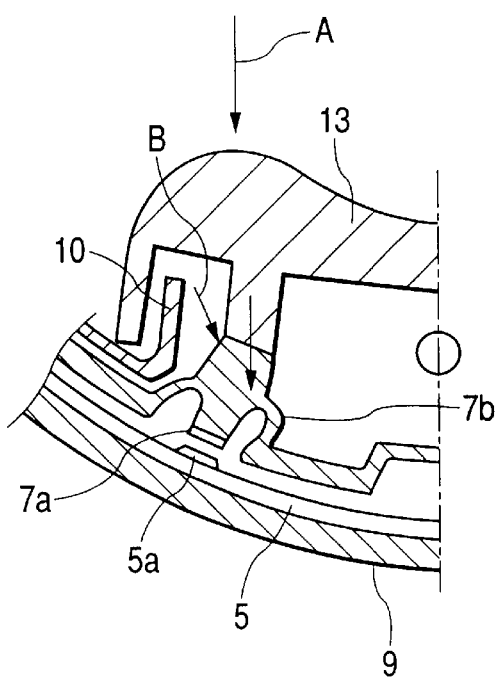
FIG. 12 is a view explanatory of a problem encountered when operating a switch mechanism.
Figure 13:
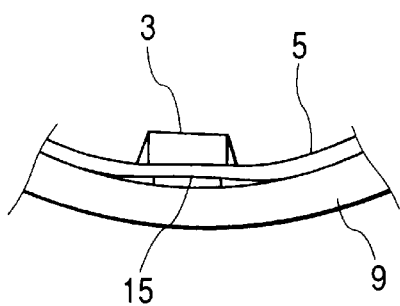
FIG. 13 is a view explanatory of a problem with a lower casing structure shown in FIG. 10.

With this construction, by adjusting the degree of bending of the thin hinges 36, a desired one of various curved configurations for the lower casing 30 can be selected, and one kind of lower casing 30 can be used with upper casings 40A and 40B of different curved configurations shown respectively in FIGS. 9A and 9B.

In the lower casing 30 having the flat surfaces 34 connected together by the hinge, the plurality of flat surfaces 34 can be juxtaposed to one another to form a flattened form by adjusting the angle of opening of the thin hinges 36, as shown in FIG. 7. The thus flattened lower casing 30 can be used as a conveyance support plate for positioning and fixing the FPC 23 in the process of mounting the electronic parts on the FPC 23 and in the soldering process. Therefore, a conventional conveyance support plate, exclusively used in the process of mounting the electronic parts on the FPC 23 and in the soldering process, can be saved, thereby reducing the production cost of the switch unit.

In the switch unit of the present invention, the plurality of flat switch-mounting portions of the upper casing are connected together in a continuous manner by the non-flat non-switch-mounting portions, and by suitably adjusting the degree of bending or curving of the non-switch-mounting portions, the upper casing can have the curved structure as a whole which is excellent in switch operability, design and so on.

The switch-mounting portions of the upper casing, as well as those portions of the upper surface of the bottom wall of the lower casing opposed respectively to these switch-mounting portions, are defined by the flat surfaces, and the flat surfaces of the switch-mounting portions are parallel to the flat surfaces of the lower casing, respectively. Therefore, by operating the switch operating member mounted on the upper casing, each rubber wall of the rubber contact having the contact opening-closing conductor can be elastically deformed properly in the originally-expected vertical direction. Therefore, when each switch is operated, the rubber contact will not be subjected to flexural deformation different from the originally-expected deformation, and therefore is prevented from being broken.

The electronic parts are mounted in a concentrated manner on the regions of the flexible printed circuit disposed respectively on the flat surfaces of the lower wall of the lower casing corresponding respectively to the switch-mounting portions of the upper casing. Therefore, the flexible printed circuit is properly held in good contact manner with the lower casing around the joint portions of the electronic parts. Therefore, the soldered electronic parts are prevented from being lifted off the lower casing. Therefore, there will not be encountered a situation in which the joint portions lifted off the lower casing are damaged by the vibration such as vibrations of the vehicle, and therefore the joint portions formed by solder and the switch mechanism can be enhanced in durability and reliability.

Further in the switch unit in the present invention, the regions of the flexible printed circuit to which the electronic parts are soldered can be more stably held in good contact manner with the flat surfaces of the lower casing, and the effect of preventing damage of the solder joint portions due to vibrations can be enhanced.

Further in the switch unit in the present invention, by adjusting the degree of bending of the thin hinges, a desired one of various curved configurations for the lower casing can be selected, and one kind of lower casing can be used with many kinds of upper casings of different curved configurations.

What is claimed is:

1. A switch unit mounted on a curved structure comprising:
- a flexible printed circuit including a wiring circuit formed on an insulative substrate, electric parts and switch contacts being mounted on an upper surface of the flexible printed circuit;
- a lower casing which holds the flexible printed circuit and includes a bottom wall covering a lower surface of the flexible printed circuit and including a plurality of flat surfaces;
- a rubber contact, for opening and closing the switch contacts, superposed on the upper surface of the flexible printed circuit;
- an upper casing which includes an upper wall covering the rubber contact, a plurality of switch mounting portions respectively opposed to the plurality of flat surfaces of the bottom wall, said upper casing being engaged with the lower casing; and
- a plurality of key tops, for operating the rubber contact, mounted on the plurality of switch mounting portions, respectively, wherein the electric parts and the switch contacts are located above the plurality of flat surfaces.

2. A switch unit according to claim 1, wherein one of a bending portion and a bending-assisting member for enhancing the flexibility of the flexible printed circuit is provided at a portion of the flexibility of the flexible printed circuit which corresponds to a border of the flat surface.

3. A switch unit according to claim 1, wherein the adjacent flat surfaces are connected together by hinge, and the lower casing can be formed into a curved shape corresponding to the upper casing by adjusting the degree of bending the hinge.

4. A switch unit according to claim 1, wherein the bottom wall includes the plurality of flat surfaces and a curved surface.

5. A switch unit according to claim 2, wherein the bottom wall includes the plurality of flat surfaces and a curved surface, and the border of the flat surface is defined between the flat surface and the curved surface.

* * * * *